(12) United States Patent
Michael et al.

(10) Patent No.: US 6,197,645 B1
(45) Date of Patent: *Mar. 6, 2001

(54) METHOD OF MAKING AN IGFET WITH ELEVATED SOURCE/DRAIN REGIONS IN CLOSE PROXIMITY TO GATE WITH SLOPED SIDEWALLS

(75) Inventors: Mark W. Michael, Cedar Park; Robert Dawson; H. Jim Fulford, Jr., both of Austin; Mark I. Gardner, Cedar Creek; Frederick N. Hause, Austin; Bradley T. Moore, Austin; Derick J. Wristers, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/837,539

(22) Filed: Apr. 21, 1997

(51) Int. Cl.$^7$ .................................................. H01L 21/336
(52) U.S. Cl. ........................ 438/300; 438/299; 438/307; 438/592
(58) Field of Search .................... 438/494, 299, 438/300, 307, 529, 592, 305, 585, 527, 530, 301, 306

(56) References Cited

U.S. PATENT DOCUMENTS

| | | | |
|---|---|---|---|
| 4,074,300 | * 2/1978 | Sakai et al. | 257/387 |
| 4,379,005 | * 4/1983 | Hovel et al. | 438/571 |
| 4,558,338 | * 12/1985 | Sakata | 257/387 |
| 4,601,781 | 7/1986 | Mercier et al. | 156/643 |
| 4,945,070 | * 7/1990 | Hsu | 438/224 |
| 5,300,816 | 4/1994 | Lee et al. | 257/797 |
| 5,308,415 | 5/1994 | Chou | 156/643 |
| 5,457,060 | 10/1995 | Chang | 437/34 |
| 5,504,031 | 4/1996 | Hsu et al. | 437/57 |
| 5,578,838 | * 11/1996 | Cho et al. | 257/66 |
| 5,710,450 | * 1/1998 | Chau et al. | 438/300 |
| 5,937,299 | * 8/1999 | Michael et al. | 438/300 |
| 5,953,605 | * 9/1999 | Kodama | 438/300 |

OTHER PUBLICATIONS

Adams and Capio, "Edge Profiles in the Plasma Etching of Polycrystalline Silicon," *Journal of the Electrochemical Society*, vol. 128, pp. 366–370 (Feb. 1981).

Silicon Processing for the VLSI ERA–vol. 1: Process Technology, by S. Wolf, published by Lattice Press, Sunset Beach, CA, 1986, pp. 155–156.

* cited by examiner

*Primary Examiner*—Charles Bowers
*Assistant Examiner*—Jack Chen
(74) *Attorney, Agent, or Firm*—Skjerven Morrill MacPherson LLP

(57) ABSTRACT

An IGFET with elevated source and drain regions in close proximity to a gate with sloped sidewalls is disclosed. A method of making the IGFET includes forming a lower gate level over a semiconductor substrate, wherein the lower gate level includes a top surface, a bottom surface and sloped opposing sidewalls, and the top surface has a substantially greater length than the bottom surface, and depositing a semiconducting layer on the lower gate level and on underlying source and drain regions of the semiconductor substrate to form an upper gate level on the lower gate level, an elevated source region on the underlying source region, and an elevated drain region on the underlying drain region. The elevated source and drain regions are separated from the lower gate level due to a retrograde slope of the sidewalls of the lower gate level, and the elevated source and drain regions are separated from the upper gate level due to a lack of step coverage in the semiconducting layer. The method also includes implanting a dopant into the elevated source and drain regions, and diffusing the dopant from the elevated source and drain regions into the underlying source and drain regions. Preferably, the semiconducting layer is deposited by epitaxial deposition, the lower gate level is substantially thicker than the semiconducting layer, the elevated source and drain regions include sidewalls beneath and substantially aligned with sidewalls of the upper gate level, and all source/drain doping in the underlying source and drain regions is diffused from the elevated source and drain regions. In this manner, a highly miniaturized IGFET can be provided with shallow channel junctions without the need for sidewall spacers adjacent to the gate.

18 Claims, 2 Drawing Sheets

METHOD OF MAKING AN IGFET WITH ELEVATED SOURCE/DRAIN REGIONS IN CLOSE PROXIMITY TO GATE WITH SLOPED SIDEWALLS

BACKGROUND OF THE INVENTION

1. Field of the Invention

The present invention relates to integrated circuit manufacturing, and more particularly to forming insulated-gate field-effect transistors with elevated source/drain regions.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal that would otherwise melt the aluminum.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the sidewalls of the gate, and a heavy implant is self-aligned to spacers adjacent to the sidewalls of the gate. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics.

There are, however, several drawbacks to using ion implantation. A phenomena called "channeling" may occur when the ion beam which implants the dopants is closely aligned with the crystal lattice of the silicon. When channeling occurs, the dopants are initially implanted deeper beneath the top surface of the substrate, but then as implantation continues the substrate surface becomes amorphous and less channeling occurs. Unfortunately, the depth of the channeled dopants is difficult to control. Channeling can be avoided by tilting the substrate (typically, at an angle of 7°) with respect to the ion beam. However, implanting off-axis can cause asymmetric doping of the source and drain regions.

Another drawback of ion implantation is random scattering of the implanted dopants. The random scattering results in a small portion of implanted regions, measured as the "lateral straggle," being disposed beneath the mask.

A further drawback of ion implantation is that the concentration (or doping profile) of the implanted dopants typically forms a gaussian distribution along the vertical axis in which the peak concentration is substantially below the top surface of the substrate. Furthermore, driving-in the dopants by high-temperature processing causes the implanted dopants to diffuse farther into the substrate.

A strategy for enhancing IGFET performance is to have the dopant atoms as close to the surface of the substrate as possible. Restricting current flow to a very narrow layer between the source and drain tends to improve current drive properties, and also reduce off-state leakage current. Accordingly, as IGFET dimensions are reduced, it is highly desirable to form shallow channel junctions on the order of 0.01 to 0.10 microns deep in order to improve transistor performance.

Introducing source/drain doping into the substrate by solid phase diffusion from elevated source and drain regions is known in the art. With this approach, after the gate and sidewall spacers are formed, epitaxial silicon is selectively deposited (also referred to as "grown") on regions of the substrate adjacent to the spacers to form the elevated source and drain regions on the substrate. Thereafter, a dopant is implanted into the elevated source and drain regions, and a thermal cycle is applied to diffuse the dopant from the elevated source and drain regions into underlying source and drain regions in the substrate. As a result, shallow channel junctions can be formed in the substrate without ion implantation. If desired, doped glass spacers can also be utilized to diffuse a dopant into the underlying source and drain regions to assure that the channel junctions are substantially aligned with the sidewalls of the gate. See, for instance, U.S. Pat. No. 5,504,031 to Hsu et al.

A drawback to conventional elevated source and drain structures is that typically the spacers are essential to prevent shorting the elevated source and drain regions to the gate, and the spacers occupy valuable chip area. Although disposable spacers can be employed and subsequently removed, the additional chip area is still required. Another drawback is that the channel length is often limited by the minimum resolution of the photolithographic system, since a substantial overlap between the gate and the source/drain may create unwanted capacitive effects. These drawbacks tend to constrain efforts towards further miniaturizing the device.

Accordingly, a need exists for a method of fabricating an IGFET with shallow source and drain junctions in a manner that provides for further reductions in device size.

SUMMARY OF THE INVENTION

A primary object of the invention is to provide a highly miniaturized IGFET with elevated source and drain regions without the need for sidewall spacers. This is accomplished by disposing the elevated source and drain regions in close proximity to a gate with sloped sidewalls.

In accordance with one aspect of the invention, a method of forming an IGFET includes forming a lower gate level over a semiconductor substrate, wherein the lower gate level includes a top surface, a bottom surface and sloped opposing sidewalls, and the top surface has a substantially greater length than the bottom surface, and depositing a semiconducting layer on the lower gate level and on underlying source and drain regions of the semiconductor substrate to form an upper gate level on the lower gate level, an elevated source region on the underlying source region, and an elevated drain region on the underlying drain region. The elevated source and drain regions are separated from the lower gate level due to a retrograde slope of the sidewalls of the lower gate level, and the elevated source and drain regions are separated from the upper gate level due to a lack of step coverage in the semiconducting layer. The method further includes implanting a dopant into the elevated source and drain regions, and diffusing the dopant from the elevated source and drain regions into the underlying source and drain regions. The IGFET thus formed has a gate that includes the lower and upper gate levels, a source that includes the elevated and underlying source regions, and a drain that includes the elevated and underlying drain regions.

Preferably, the semiconducting layer is deposited by epitaxial deposition, the lower gate level is substantially thicker than the semiconducting layer, and the elevated source and drain regions include sidewalls beneath and substantially aligned with sidewalls of the upper gate level. It is also preferred that all source/drain doping in the underlying source and drain regions is diffused from the elevated source and drain regions, and that the elevated source and drain regions are heavily doped and the underlying source and drain regions are lightly doped.

An advantage of the invention is that a highly miniaturized IGFET can be provided with shallow channel junctions without the need for sidewall spacers adjacent to the gate. Another advantage is that a single implant step can provide doping for lightly and heavily doped source and drain regions. Yet another advantage is that the structure is well-suited for forming densely-packed unbridged silicide contacts for the gate, source and drain. Still another advantage is that the channel length can be considerably narrower than the minimum resolution of the available photolithographic system without creating unwanted capacitive effects due to overlap between the gate and the source/drain.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
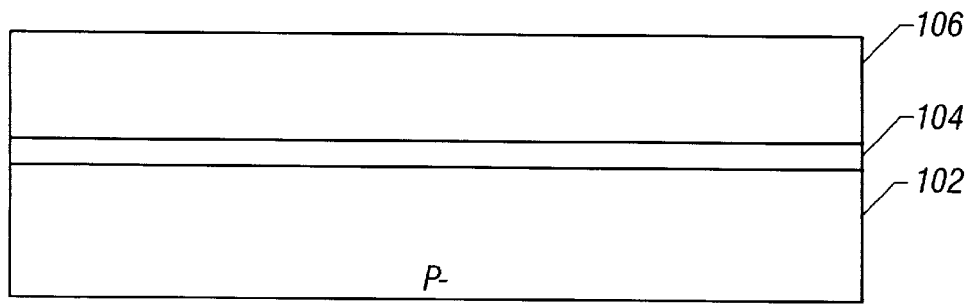
FIGS. 1A–1H show cross-sectional views of successive process steps for forming an IGFET with elevated source and drain regions in close proximity to a gate with sloped sidewalls in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes a P-type epitaxial surface layer disposed on a P+base layer (not shown). The epitaxial surface layer provides an active region with a boron background concentration on the order of $1\times10^{16}$ atoms/cm$^3$, a <100> orientation and a resistivity of 12 ohm-cm. Substrate 102 can be subjected to a threshold voltage implant, a punch-through implant, and a well implant as is conventional. For convenience of illustration, dielectric isolation such as field oxides between adjacent active regions is not shown. A blanket layer of gate oxide 104, composed of silicon dioxide (SiO$_2$), is formed on the top surface of substrate 102 using tube growth at a temperature of 700 to 1000° C. in an O$_2$ containing ambient. Gate oxide 104 has a thickness in the range of 30 to 100 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 106 be initially doped via diffusion from an overlaying semiconducting layer, as described below.

Figure 1B:
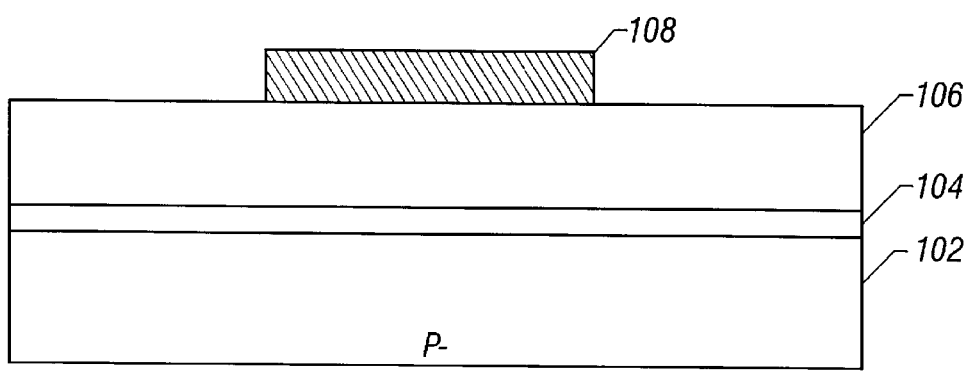

In FIG. 1B, photoresist 108 is deposited on polysilicon 106 and patterned to selectively expose polysilicon 106. Photoresist 108 is patterned using a photolithographic system, such as a step and repeat optical projection system, in which deep ultraviolet light from a mercury-vapor lamp is projected through a reticle and a focusing lens to obtain the desired image pattern. For illustration purposes, the minimum resolution of the photolithographic system is 3500 angstroms (0.35 microns). Thereafter, photoresist 108 is developed and the irradiated portions are removed, so that photoresist 108 has a length (or linewidth) of 3500 angstroms.

Figure 1C:
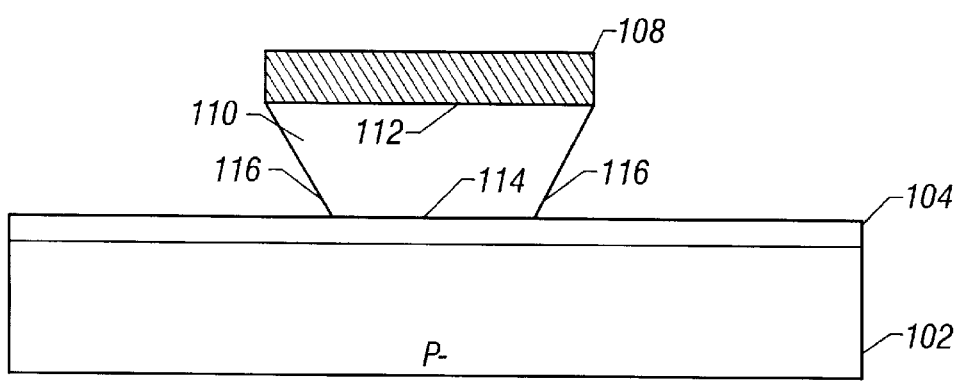

In FIG. 1C, a dry etch is applied that removes all polysilicon 106 outside photoresist 108, and also removes portions of polysilicon 106 beneath photoresist 108. The remaining (unetched) polysilicon 106 provides lower gate level 110 with a trapezoid-like shape in which the length increases as the height increases. The dry etch is highly selective of polysilicon and non-selective of silicon dioxide so that only a negligible amount of gate oxide 104 is removed and substrate 102 is unaffected. The dry etch is also re-entrant and the lateral etch rate of polysilicon 106 increases as the depth of polysilicon 106 increases. This can be accomplished by selecting appropriate etch parameters so that as etching occurs, polymer from photoresist 108 builds up on the sidewalls of polysilicon 106 as a function of the depth of polysilicon 106. For instance, various etching profiles from the dry etching of polysilicon produced with an AZ-1350 DQN photoresist and various etchants under anisotropic and isotropic conditions are reported by Adams and Capio in "Edge Profiles in the Plasma Etching of Polycrystalline Silicon," *Journal of the Electrochemical Society*, Vol. 128, pp. 366–370 (February 1981), which is incorporated herein by reference. The etching profiles reported by Adams and Capio include substantially linear sidewalls that slope outward with increasing height.

After etching occurs, lower gate level 110 includes planar top surface 112, planar bottom surface 114, and substantially linear opposing sidewalls 116 with a retrograde slope that slopes outward as the height of lower gate level 110 increases. Top surface 112 has a length of 3500 angstroms, bottom surface 114 has a length of 3000 angstroms, and sidewalls 116 each extend 250 angstroms lengthwise between top surface 112 and bottom surface 114.

Figure 1D:
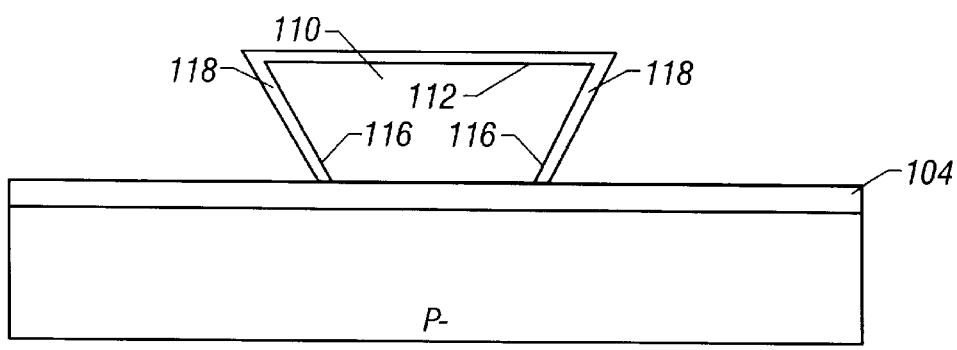

In FIG. 1D, photoresist 108 is stripped thereby exposing top surface 112 of lower gate level 110. Thereafter, liner oxide 118 composed of silicon dioxide is thermally grown on the exposed polysilicon surfaces, which include top surface 112 and sidewalls 116 of lower gate level 110, using tube growth at a temperature of 700 to 1000° C. in an $O_2$ containing ambient. Liner oxide 118 provides a continuous layer with a thickness in the range of 50 to 200 angstroms. The thermal oxidation also slightly increases the thickness of the exposed gate oxide 104.

Figure 1E:
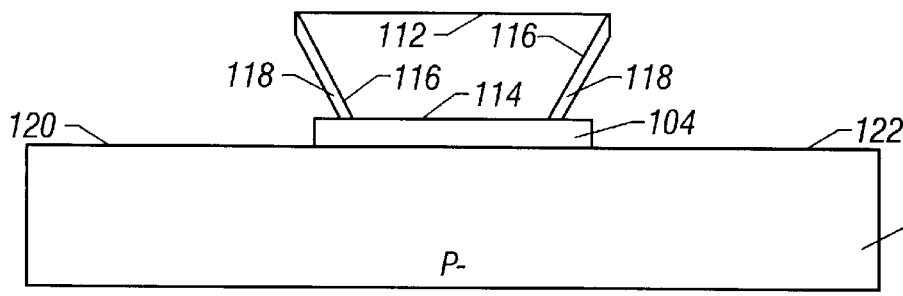

In FIG. 1E, a anisotropic reactive ion etch is applied that is highly selective of silicon dioxide with respect to polysilicon (and silicon). The etch removes the oxide regions that are not beneath top surface 112 while leaving intact the oxide regions that are beneath top surface 112. In particular, liner oxide 118 is removed from top surface 112, and gate oxide 104 is removed from regions 120 and 122 of substrate 102 that extend outside top surface 112 but are laterally spaced from bottom surface 114. As a result, top surface 112 and regions 120 and 122 are exposed. However, gate oxide 104 remains on substrate 102 beneath top surface 112, and liner oxide 118 remains on sidewalls 116 beneath top surface 112.

Figure 1F:
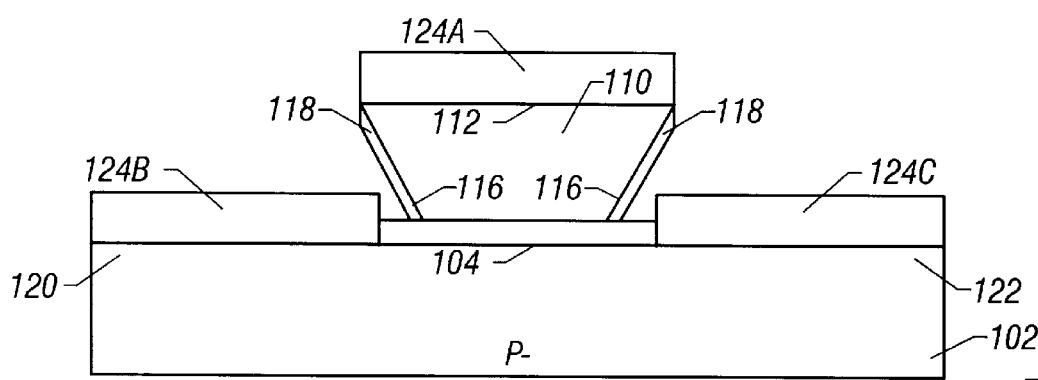

In FIG. 1F, epitaxial silicon 124 is selectively deposited on the exposed silicon (including polysilicon) surfaces. There are basically two types of selective epitaxial deposition processes. In "Type 1" processes, epitaxial growth occurs only on the exposed silicon and no growth occurs on the exposed oxide. In "Type 2" processes, epitaxial growth occurs on both the exposed silicon and the exposed oxide. Epitaxial silicon 124 is deposited using a Type 1 process. $SiCl_4$ and $SiHCl_3$ provide suitable silicon sources. $SiH_2Cl_2$ and $SiH_4$ also provide suitable silicon sources if HCl or $Cl_2$ is added to the reaction. Furthermore, bromine based silicon compounds such as $SiHBr_3$ and $SiBr_4$ have shown improved selectivity over their chlorinated counterparts. Factors that enhance the selective nature of a Type 1 process include reduced pressure, increased temperature, and decreased mole fraction of the silicon source in the gas stream. Selective deposition of epitaxial silicon is well-known in the art. See, for instance, SILICON PROCESSING FOR THE VLSI ERA, Volume 1: Process Technology, by S. Wolf and R. N. Tauber, published by Lattice Press, Sunset Beach, Calif., pp. 155–156 (1986), which is incorporated by reference.

Epitaxial silicon 124 has a thickness of 1000 angstroms and forms upper gate level 124A on top surface 112 of lower gate level 110, elevated source region 124B on region 120 of substrate 102, and elevated drain region 124C on region 122 of substrate 102. Upper gate level 124A and elevated source and drain regions 124B and 124C have essentially identical compositions, essentially identical thicknesses and are formed simultaneously. Furthermore, the thickness of lower gate level 110 (2000 angstroms) is substantially greater than the thicknesses (1000 angstroms) of elevated source and drain regions 124B and 124C. As a result, the left sidewall of upper gate level 124A is substantially aligned with and above and separated from the right sidewall of elevated source region 124B, and likewise, the right sidewall of upper gate level 124C is substantially aligned with and above and separated from the left sidewall of elevated drain region 124C. As is seen, elevated source and drain regions 124B and 124C are spaced from sidewalls 116 due to the retrograde slopes of sidewalls 116. In addition, liner oxide 118 on sidewalls 116 assures that any portions of elevated source and drain regions 124B and 124C that might extend beneath top surface 112 remain electrically isolated from lower gate level 110. Furthermore, a multilevel gate that consists of lower gate level 110 and upper gate level 124A is spaced from and electrically isolated from elevated source and drain regions 124B and 124C.

Of importance, upper gate level 124A is separated from elevated source and drain regions 124B and 124C due to a lack of step coverage of epitaxial silicon 124, using lower gate level 110 and gate oxide 104 as the step above substrate 102. Step coverage is a measure of how well a film maintains its nominal thickness as it crosses a step. Step coverage is expressed by the ratio of the minimum thickness of a film as it crosses a step, $t_s$, to the nominal thickness of the film on horizontal regions, $t_n$. That is, $$\text{Step coverage } (\%) = (t_s/t_n) \times 100\% \qquad (1)$$

Step coverage of 100% is ideal for a conductive line, but in general the height of the step and the aspect ratio of the features being covered impact the expected step coverage. The greater the step height or aspect ratio, the more difficult it is to attain coverage of the step without a corresponding thinning of the overlying film. In addition to step height and aspect ratio, step coverage depends on the contour and slope of the step. In general, a smoother step and the less vertical its slope, the better the step coverage will be. With epitaxial silicon 124 there is 0% step coverage, or stated differently, a lack of step coverage. That is, upper gate level 124A, elevated source region 124B and elevated drain region 124C are separated segments formed simultaneously as a blanket layer of epitaxial silicon 124 is deposited on lower gate level 110 and regions 120 and 122 of substrate 102. Advantageously, upper gate level 124A is separated from elevated source and drain regions 124B and 124C without the need for spacers extending beyond top surface 112, and without the need for subsequent etching or polishing steps.

Figure 1G:
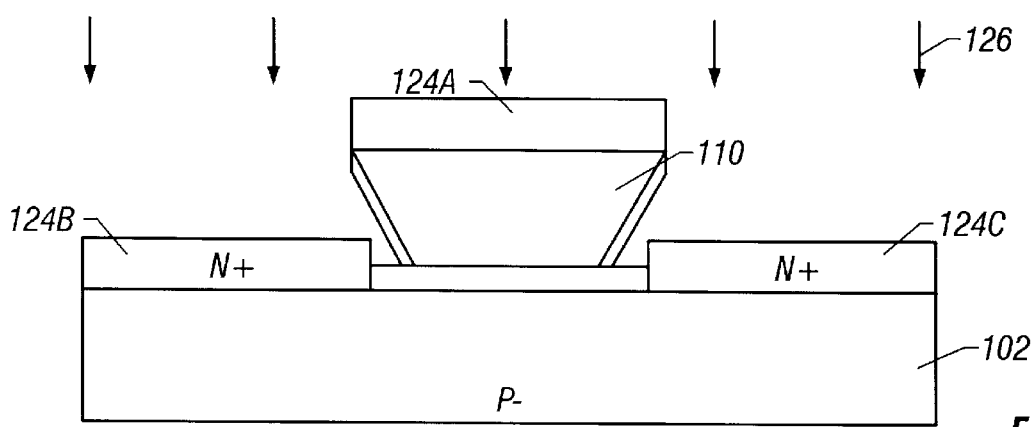

In FIG. 1G, the structure is subjected to ion implantation of arsenic and phosphorus, as indicated by arrows 126, at a dosage in the range of $1\times10^{15}$ to $5\times10^{15}$ atoms/cm$^2$, and an energy in the range of 30 to 60 kiloelectron-volts for arsenic and 10 to 40 kiloelectron-volts for phosphorus. The arsenic and phosphorus are implanted into epitaxial silicon 124; however, epitaxial silicon 124 blocks essentially all of the arsenic and phosphorus impinging thereon from being implanted into the underlying materials. That is, upper gate level 124A provides an implant mask for lower gate level 110, and elevated source and drain regions 124B and 124C provide implant masks for the underlying portions of substrate 102. As a result, elevated source and drain regions 124B and 124C are doped N+ with a dopant concentration in the range of $1\times10^{18}$ to $1\times10^{20}$ atoms/cm$^3$, and substrate 102 remains essentially devoid of N-type doping.

Figure 1H:
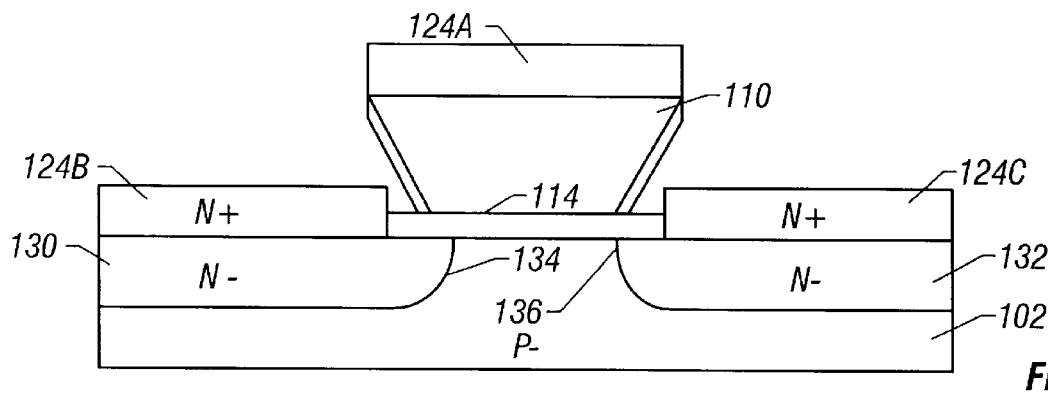

In FIG. 1H, the device is annealed to remove crystalline damage and drive-in and activate the implanted dopants using a rapid thermal anneal on the order of 950 to 1050° C. for 10 to 60 seconds. The phosphorus diffuses far more rapidly than the arsenic. As a result, phosphorus in upper gate level 124A diffuses into lower gate level 110, and phosphorus in elevated source and drain regions 124B and 124C diffuses into underlying source and drain regions 130 and 132 in substrate 102. Since the phosphorus diffuses both laterally and vertically, underlying source region 130 forms channel junction 134 that is substantially aligned with the left edge of bottom surface 114, and underlying drain region 132 forms channel junction 136 that is substantially aligned with the right edge of bottom surface 114. Underlying source and drain regions 130 and 132 are doped N− with a dopant concentration in the range of $1\times10^{17}$ to $1\times10^{18}$ atoms/cm$^3$. Channel junctions 134 and 136 define a channel between a source, that consists of elevated source region 124B and underlying source region 130, and a drain, that consists of elevated drain region 124C and underlying drain region 132, for an N-channel MOSFET controlled by a multilevel gate that consists of lower gate level 110 and upper gate level 124A.

Further processing steps in the fabrication of IGFETs typically include forming silicide contacts on the gate, source and drain, forming a thick oxide layer over the active region, forming contact windows in the oxide layer to expose the silicide contacts, forming appropriate interconnect metallization in the contact windows, and forming a passivation layer over the structure. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention is well-suited for forming densely-packed unbridged silicide contacts on the gate, source and drain. See, for instance, U.S. application Ser. No. 08/837,522, filed concurrently herewith, entitled "IGFET with Silicide Source/Drain Contacts in Close Proximity to Gate with Sloped Sidewalls" by Michael et al., which is incorporated by reference.

It should also be noted that the thick oxide layer formed over the active region (after the silicide contacts are formed) need not fill the regions between the top and bottom surfaces of the lower gate level and between the sidewalls of the lower gate level and elevated source and drain regions. In fact, leaving air gaps in these regions provides a lower dielectric constant than filling the regions with the oxide layer, thereby reducing capacitive coupling to the gate.

At completion of the process, it is preferred that the lateral locations of the channel junctions be precisely controlled. However, to the extent that these locations are not (or can not be) precisely controlled, it is far preferable to have a slight overlap between the junctions and the bottom surface of the gate as opposed to a lateral displacement or gap. While a slight overlap will lead to capacitive effects (known as "Miller capacitance") that tend to reduce switching speeds, a lateral displacement or gap may prevent the formation of a conductive channel between the source and drain during device operation or a non-controlled threshold voltage. The overlap is a function of numerous factors, including dopant concentration, the diffusion rate of the dopant, and the difference in length between the top and bottom surfaces of the gate. For instance, boron diffuses far more rapidly than phosphorus, which in turn diffuses far more rapidly than arsenic.

The present invention includes numerous variations to the embodiments described above. For instance, the gate can be various conductors, and the gate insulator and liner insulator (on the sidewalls of the lower gate level) can be various dielectrics. The liner insulator is optional. Portions of the gate insulator beneath the top surface and outside the bottom surface of the lower gate level can be removed prior to depositing the elevated source and drain regions, in which case the elevated source and drain regions may extend beneath the top surface of the lower gate level as long as they do not contact the lower or upper gate levels. The semiconducting layer that forms the upper gate level and elevated source and drain regions can be deposited by various techniques, including low pressure chemical vapor deposition in a direction normal to the top surface of the substrate. If desired, the dopant can be implanted both into the elevated source and drain regions and through the elevated source and drain regions into the underlying source and drain regions, although it is preferred that most or all of the source/drain doping for the underlying source and drain regions be diffused from the elevated source and drain regions. The conductivity types can be reversed. Suitable N-type dopants include arsenic and phosphorus; suitable P-type dopants include boron $B_{10}$, boron $B_{11}$, and $BF_X$ species such as $BF_2$. In the event P-type dopants are used, preferably suitable parameters are chosen to prevent boron penetration through the gate insulator into the channel region.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET, comprising the steps of:

forming a lower gate level over a semiconductor substrate, wherein the lower gate level includes a top surface, a bottom surface and sloped opposing sidewalls, and the top surface has a substantially greater length than the bottom surface;

depositing a semiconducting layer on the lower gate level and on underlying source and drain regions of the semiconductor substrate to form an upper gate level on the lower gate level, an elevated source region on the underlying source region, and an elevated drain region on the underlying drain region, wherein the elevated source and drain regions are separated from the upper gate level due to a lack of step coverage in the semiconducting layer;

implanting a dopant into the elevated source and drain regions; and diffusing the dopant from the elevated source and drain regions into the underlying source and drain regions.

2. The method of claim 1, including depositing the semiconducting layer by epitaxial deposition.

3. The method of claim 1, including depositing the semiconducting layer by chemical vapor deposition.

4. The method of claim 1, including implanting the dopant into the elevated source and drain regions without implanting the dopant into the underlying source and drain regions.

5. The method of claim 1, wherein the dopant provides essentially all source and drain doping in the elevated and underlying source and drain regions.

6. The method of claim 1, wherein the lower gate level has a substantially greater thickness than that of the semiconducting layer.

7. The method of claim 1, wherein sidewalls of the elevated source and drain regions are beneath and substantially aligned with opposing sidewalls of the upper gate level.

8. The method of claim 1, wherein the elevated source and drain regions are separated from the lower gate level due to a retrograde slope of the sidewalls of the lower gate level.

9. A method of forming an IGFET, comprising the steps of:

providing a semiconductor substrate of first conductivity type;

forming a gate insulator on the semiconductor substrate;

forming a lower gate level on the gate insulator, wherein the lower gate level includes a top surface, a bottom surface and opposing sidewalls, the top surface has a substantially greater length than the bottom surface, and the opposing sidewalls of the lower gate level have a retrograde slope that extends outwardly as a height of the lower gate level increases;

removing regions of the gate insulator outside the lower gate level;

depositing an epitaxial semiconducting layer on the lower gate level and on underlying source and drain regions of the semiconductor substrate to form an upper gate level on the lower gate level, an elevated source region on the underlying source region, and an elevated drain region on the underlying drain region, wherein the lower gate level is substantially thicker than the epitaxial semiconducting layer, sidewalls of the elevated source and drain regions are beneath and substantially aligned with opposing sidewalls of the upper gate level, the elevated source and drain regions are spaced from the lower gate level due to the retrograde slope of the opposing sidewalls of the lower gate level, and the elevated source and drain regions are separated from the upper gate level due to a lack of step coverage in the epitaxial semiconducting layer;

implanting a dopant of second conductivity type into the elevated source and drain regions; and diffusing the dopant from the elevated source and drain regions into the underlying source and drain regions.

10. The method of claim 9, wherein diffusing the dopant converts the underlying source and drain regions from first conductivity type into second conductivity type.

11. The method of claim 10, wherein after diffusing the dopant, the elevated source and drain regions are heavily doped, and the underlying source and drain regions are lightly doped.

12. The method of claim 10, wherein after diffusing the dopant, the underlying source and drain regions provide channel junctions substantially aligned with intersections of the opposing sidewalls and bottom surface of the lower gate level.

13. The method of claim 9, wherein the opposing sidewalls of the lower gate level are exposed during deposition of the epitaxial semiconducting layer.

14. The method of claim 9, wherein the opposing sidewalls of the lower gate level are covered with a liner oxide during deposition of the epitaxial semiconducting layer.

15. The method of claim 9, wherein the IGFET includes a gate, the gate consists of the lower and upper gate levels.

16. The method of claim 9, wherein the length of the top surface is at least 500 angstroms larger than the length of the bottom surface.

17. The method of claim 9, wherein the lower gate level is at least twice as thick as the epitaxial semiconducting layer.

18. A method of forming an IGFET, comprising the steps of:

providing a semiconductor substrate of first conductivity type;

forming a gate oxide on the semiconductor substrate;

forming a polysilicon layer on the gate oxide;

forming a masking layer over the polysilicon layer;

applying a dry etch that removes portions of the polysilicon layer beneath openings in the masking layer and portions of the polysilicon layer beneath the masking layer, wherein an unetched portion of the polysilicon layer forms a lower gate level that includes a top surface, a bottom surface and opposing sidewalls, the top surface has a length that is substantially greater than that of the bottom surface, and the opposing sidewalls of the lower gate level have a retrograde slope that extends outward as a height of the lower gate level increases;

removing regions of the gate oxide outside the lower gate level;

depositing an epitaxial semiconducting layer on the lower gate level and on underlying source and drain regions of the semiconductor substrate to simultaneously form an upper gate level on the lower gate level, an elevated source region on the underlying source region, and an elevated drain region on the underlying drain region, wherein the lower gate level is at least twice as thick as the epitaxial semiconducting layer, sidewalls of the elevated source and drain regions are beneath and substantially aligned with opposing sidewalls of the upper gate level, the elevated source and drain regions are spaced from the lower gate level due to the retrograde slope of the opposing sidewalls of the lower gate level, and the elevated source and drain regions are separated from the upper gate level due to a lack of step coverage in the epitaxial semiconducting layer;

implanting a dopant of second conductivity type into the elevated source and drain regions, thereby doping the elevated source and drain regions as heavily doped source and drain regions; and diffusing the dopant from the elevated source and drain regions into the underlying source and drain regions, thereby doping the underlying source and drain regions as lightly doped source and drain regions and converting the underlying source and drain regions from first conductivity type to second conductivity type.

* * * * *